United States Patent
Motonaga

(10) Patent No.: US 10,483,173 B2
(45) Date of Patent: Nov. 19, 2019

(54) SEMICONDUCTOR DEVICE INSPECTION METHOD AND SEMICONDUCTOR DEVICE MANUFACTURING METHOD

(71) Applicants: Kabushiki Kaisha Toshiba, Minato-ku, Tokyo (JP); Toshiba Electronic Devices & Storage Corporation, Minato-ku, Tokyo (JP)

(72) Inventor: Ikuo Motonaga, Ibo Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/030,924

(22) Filed: Jul. 10, 2018

(65) Prior Publication Data

US 2019/0295901 A1    Sep. 26, 2019

(30) Foreign Application Priority Data

Mar. 23, 2018  (JP) .................................. 2018-056309

(51) Int. Cl.
    *H01L 21/66*    (2006.01)
    *H01L 21/56*    (2006.01)

(52) U.S. Cl.
    CPC .............. *H01L 22/12* (2013.01); *H01L 21/56* (2013.01)

(58) Field of Classification Search
    CPC .................................. H01L 22/12; H01L 21/56
    See application file for complete search history.

(56) References Cited

U.S. PATENT DOCUMENTS

| 5,877,859 | A | * | 3/1999 | Aspnes | G01J 3/02 |
| | | | | | 250/225 |
| 6,954,274 | B2 | * | 10/2005 | Sasaki | G01N 21/95684 |
| | | | | | 356/606 |
| 7,782,468 | B2 | | 8/2010 | Courteville | |
| 2006/0030060 | A1 | * | 2/2006 | Noguchi | B82Y 15/00 |
| | | | | | 438/14 |
| 2015/0276388 | A1 | * | 10/2015 | Akita | G01B 11/24 |
| | | | | | 356/364 |

FOREIGN PATENT DOCUMENTS

| JP | 4596422 B2 | 12/2010 |
| JP | 4803568 B2 | 10/2011 |
| JP | 5196351 B2 | 5/2013 |

* cited by examiner

*Primary Examiner* — Karen Kusumakar
(74) *Attorney, Agent, or Firm* — White & Case LLP

(57) ABSTRACT

A semiconductor device inspection method according to an embodiment includes irradiating a semiconductor chip or a metal member with first inspection light having a plurality of linear beams parallel to each other from a first direction inclining with respect to a top surface of a substrate, the semiconductor chip being disposed on the substrate, and the metal member being disposed on the semiconductor chip; obtaining a first image of the semiconductor chip irradiated with the first inspection light or the metal member irradiated with the first inspection light; and calculating first three-dimensional information of the semiconductor chip or the metal member based on the first image by using an optical cutting method.

10 Claims, 15 Drawing Sheets

FIRST DIRECTION

SECOND DIRECTION

FIRST DIRECTION

FIRST DIRECTION

SEMICONDUCTOR DEVICE INSPECTION METHOD AND SEMICONDUCTOR DEVICE MANUFACTURING METHOD

This application is based upon and claims the benefit of priority from Japanese Patent Application No. 2018-056309, filed on Mar. 23, 2018, the entire contents of which are incorporated herein by reference.

FIELD

Embodiments described herein relate generally to a semiconductor device inspection method and a semiconductor device manufacturing method.

BACKGROUND

To realize high product yield, inspection of an external appearance of a semiconductor chip disposed on a lead frame, and inspection of an external appearance of a metal member such as a connector or a heat dissipation part disposed on a semiconductor chip are performed during a semiconductor manufacturing process. For example, to realize double-sided heat dissipation, there is provided a semiconductor package with a metal member such as a connector or a heat dissipation part exposed from a top surface of a sealing resin. According to such a semiconductor package, control of a top surface height and a top surface inclination of the metal member directly leads to a product yield. Furthermore, by increasing a throughput of the external appearance inspection, it is possible to reduce semiconductor package manufacturing cost. Therefore, it is demanded to three-dimensionally measure a top surface of an inspection object in a short time during the external appearance inspection.

DETAILED DESCRIPTION

Figure 1A:
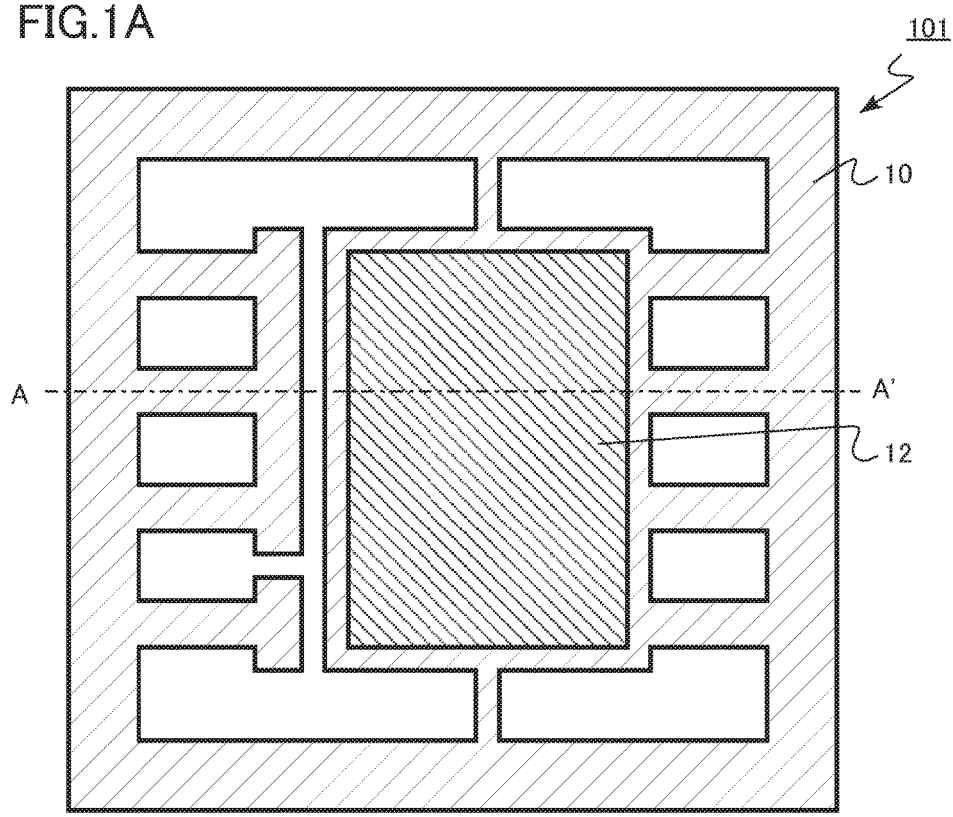
FIGS. 1A and 1B are schematic views of an example of an inspection object of a semiconductor device inspection method according to a first embodiment.

The same or similar members in this description will be assigned the same reference numerals, and overlapping description will be omitted in some cases.

First Embodiment

A semiconductor device inspection method according to the first embodiment includes irradiating a semiconductor chip or a metal member with first inspection light having a plurality of linear beams parallel to each other from a first direction inclining with respect to a top surface of a substrate, the semiconductor chip being disposed on the substrate, and the metal member being disposed on the semiconductor chip; obtaining a first image of the semiconductor chip irradiated with the first inspection light or the metal member irradiated with the first inspection light; and calculating first three-dimensional information of the semiconductor chip or the metal member based on the first image by using an optical cutting method. The semiconductor device inspection method further includes irradiating the semiconductor chip or the metal member with second inspection light having a plurality of linear beams parallel to each other from a second direction inclining with respect to the top surface of the substrate, and the second direction being different from the first direction; obtaining a second image of the semiconductor chip irradiated with the second inspection light or the metal member irradiated with the second inspection light; and calculating second three-dimensional information of the semiconductor chip or the metal member based on the second image by using the optical cutting method.

The semiconductor device inspection method according to the first embodiment is a method for three-dimensionally measuring the top surface of the semiconductor chip disposed on the substrate or the top surface of the metal member disposed on the semiconductor chip.

Figure 1B:
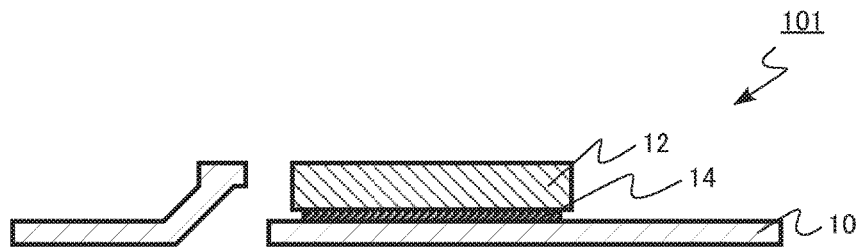

FIGS. 1A and 1B are schematic views of an example of an inspection object of the semiconductor device inspection method according to the first embodiment. FIG. 1A is an upper view, and FIG. 1B is an AA' cross-sectional view of FIG. 1A.

An inspection object 101 illustrated in FIGS. 1A and 1B is a semiconductor chip 12 disposed on a lead frame 10. The semiconductor chip 12 is, for example, a metal oxide field effect transistor (MOSFET). The lead frame 10 is an example of a substrate. The lead frame 10 is a metal.

The semiconductor chip 12 is fixed onto the lead frame 10 by an adhesive 14. The adhesive 14 is, for example, silver paste or solder.

Figure 2A:
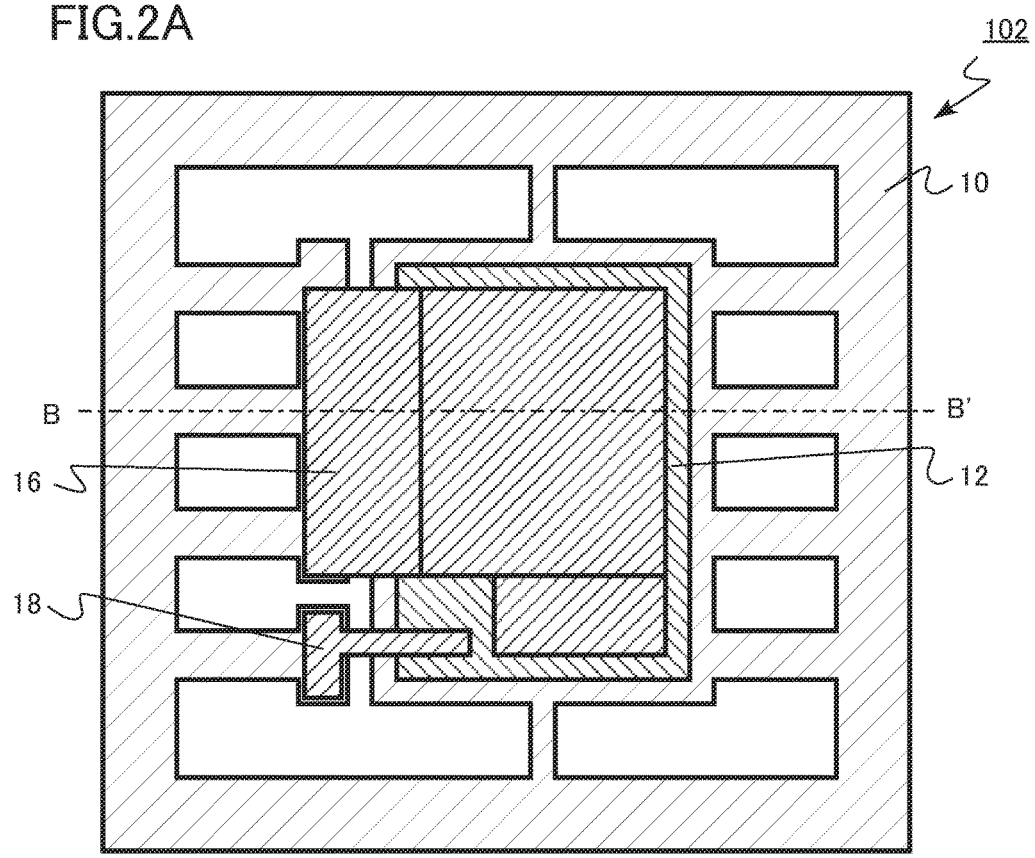
FIGS. 2A and 2B are schematic views of another example of an inspection object of the semiconductor device inspection method according to the first embodiment.
Figure 2B:
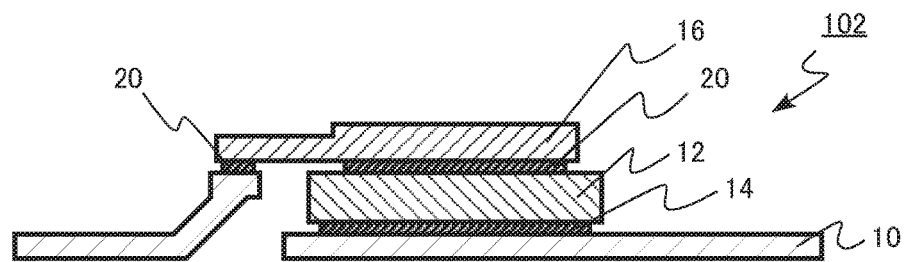

FIGS. 2A and 2B are schematic views of another example of an inspection object of the semiconductor device inspection method according to the first embodiment. FIG. 2A is an upper view, and FIG. 2B is a BB' cross-sectional view of FIG. 2A.

The inspection object 102 illustrated in FIGS. 2A and 2B includes the semiconductor chip 12, a connector 16 and a connector 18 disposed on the lead frame 10. The semiconductor chip 12 is, for example, a MOSFET.

The semiconductor chip 12 is fixed onto the lead frame 10 by the adhesive 14. The adhesive 14 is, for example, silver paste or solder.

The connector 16 and the connector 18 are metal. The connector 16 and the connector 18 electrically connect the semiconductor chip 12 and the lead frame 10. For example, a part of the connector 16 may be exposed from a top surface of the molding resin after sealed with a molding resin, and functions as a heat dissipation member. The connector 16 and the connector 18 are examples of metal members.

The connector 16 and the connector 18 are fixed onto the semiconductor chip 12 and the lead frame 10 by an adhesive 20. The adhesive 20 is, for example, silver paste or solder.

Figure 3:
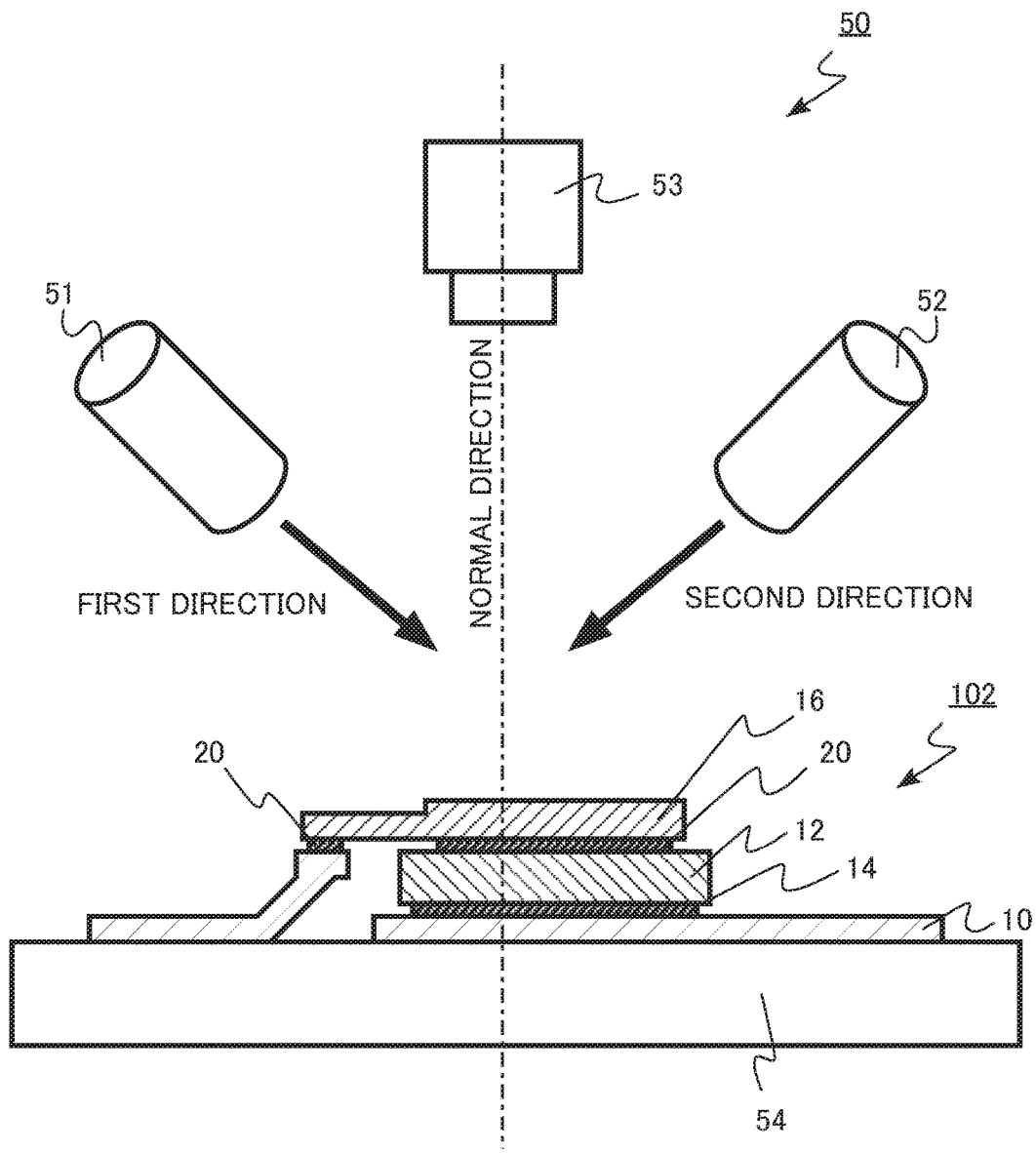
FIG. 3 is a conceptual diagram of an inspection system of the semiconductor device inspection method according to the first embodiment.

FIG. 3 is a conceptual diagram of an inspection system of the semiconductor device inspection method according to the first embodiment. An inspection system 50 includes a first light emitting diode (LED) projector 51, a second LED projector 52, a charge coupled device (CCD) camera 53 and a stage 54. A case where an inspection object is the inspection object 102 illustrated in FIGS. 2A and 2B will be described below.

The inspection object 102 is disposed on the stage 54. The inspection object 102 includes the lead frame 10, the semiconductor chip 12 and the connector 16.

The first LED projector 51 irradiates the inspection object 102 with first inspection light having a plurality of linear beams parallel to each other from a first direction inclining with respect to a top surface of the lead frame 10. An inclination angle of the first direction with respect to the top surface of the lead frame 10 is, for example, 20 degrees or more and 70 degrees or less.

The second LED projector 52 irradiates the inspection object 102 with second inspection light having a plurality of linear beams parallel to each other from a second direction inclining with respect to the top surface of the lead frame 10. The second direction is different from the first direction. An inclination angle of the second direction with respect to the top surface of the lead frame 10 is, for example, 20 degrees or more and 70 degrees or less.

The CCD camera 53 is provided in, for example, a normal direction of the top surface of the lead frame 10. The COD camera 53 obtains an image of the inspection object 102 irradiated with the first light. Furthermore, the CCD camera 53 obtains an image of the inspection object 102 irradiated with the second light. The CCD camera 53 obtains, for example from right above, the image of the inspection object 102 irradiated with the first light. Furthermore, the COD camera 53 obtains, for example from right above, the image of the inspection object 102 irradiated with the second light.

The semiconductor device inspection method according to the first embodiment inspects an external appearance of an inspection object by using the inspection system 50. The semiconductor device inspection method according to the first embodiment will be described below based on an example of the case where an inspection object is the inspection object 102 illustrated in FIGS. 2A and 2B.

The semiconductor device inspection method according to the first embodiment includes first three-dimensional measurement including radiation of first inspection light, obtaining a first image and calculation of first three-dimensional information, and second three-dimensional measurement including radiation of second inspection light, obtaining a second image and calculation of second three-dimensional information.

First, the inspection object 102 is disposed on the stage 54. Next, the inspection object 102 is irradiated with first inspection light having a plurality of linear beams parallel to each other from the first direction inclining with respect to the top surface of the lead frame 10. The first inspection light are radiated from the first LED projector 51.

Next, the first image of the inspection object 102 irradiated with the first inspection light is obtained. The first image is captured by the CCD camera 53.

Next, the inspection object 102 is irradiated with second inspection light having a plurality of linear beams parallel to each other from the second direction inclining with respect to the top surface of the lead frame 10. The second direction is different from the first direction. The second inspection light are radiated from the second LED projector 52.

Next, the second image of the inspection object 102 irradiated with the second inspection light is obtained. The second image is captured by the CCD camera 53.

Figure 4:
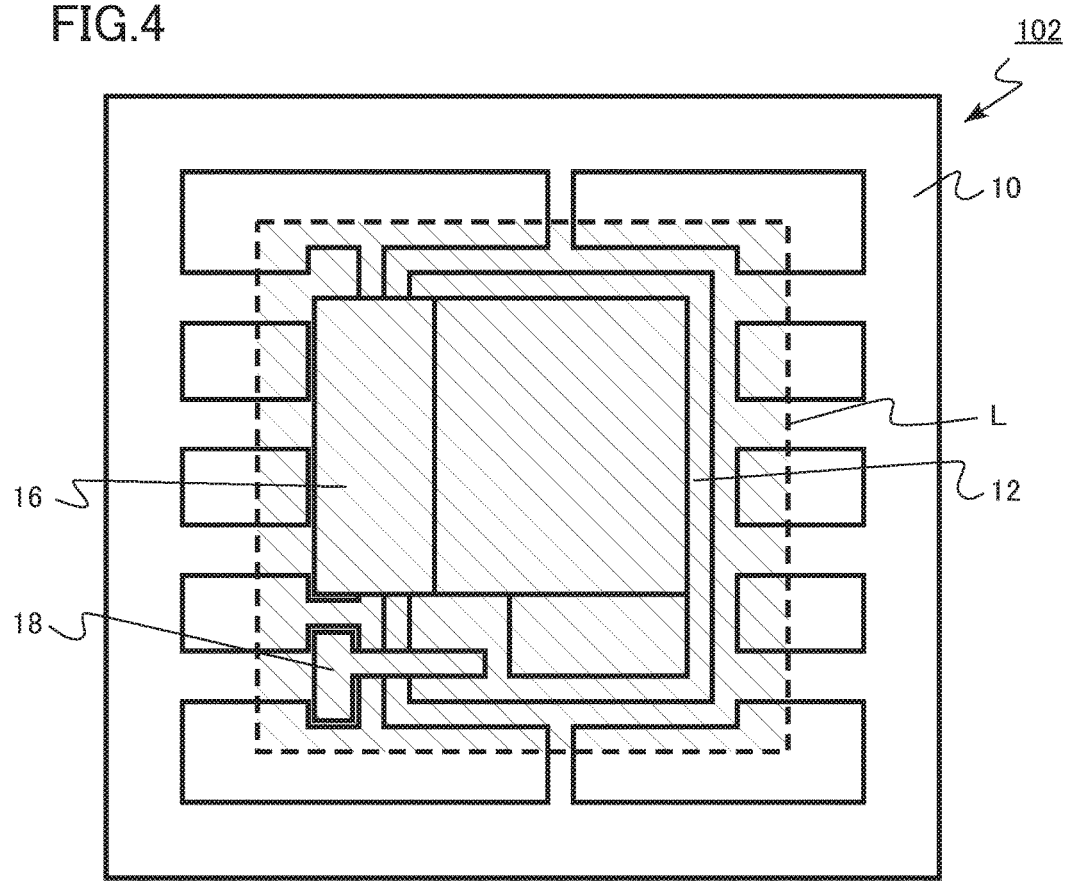
FIG. 4 is a view illustrating an irradiation range of inspection light of the semiconductor device inspection method according to the first embodiment.

FIG. 4 is a view illustrating an irradiation range of inspection light of the semiconductor device inspection method according to the first embodiment. A region L in FIG. 4 is a region irradiated with inspection light. The first inspection light and the second inspection light are collectively radiated to, for example, the connector 16, the connector 18, the semiconductor chip 12 and the lead frame 10 of the inspection object 102.

For example, the first image and the second image include images of the connector 16, the connector 18, the semiconductor chip 12 and the lead frame 10.

Figure 5A:
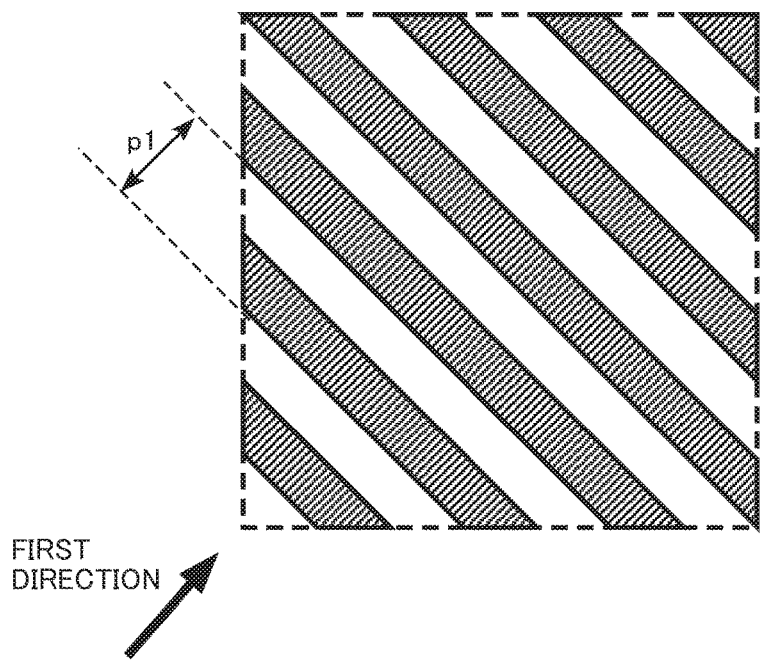
FIGS. 5A and 5B are views illustrating irradiation patterns of inspection light of the semiconductor device inspection method according to the first embodiment.
Figure 5B:
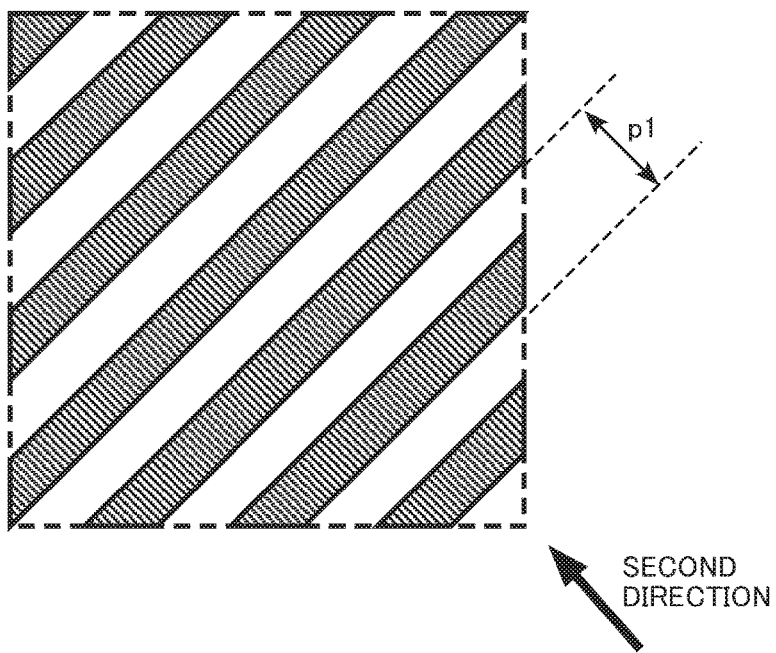

FIGS. 5A and 5B are views illustrating irradiation patterns of inspection light of the semiconductor device inspection method according to the first embodiment. FIG. 5A is the view illustrating an example of the irradiation pattern of the first inspection light. FIG. 5B is the view illustrating an example of the irradiation pattern of the second inspection light.

Hatched linear regions in FIGS. 5A and 5B are regions on which inspection light are shed. Inspection light have linear beams parallel to each other. The inspection light repeat linear regions at certain pitches (p1 in FIGS. 5A and 5B).

Linear regions of the second inspection light include patterns that obliquely cross the linear regions of the first inspection light.

After the first image is obtained, the first three-dimensional information of the inspection object 102 is calculated based on the first image by using an optical cutting method. The first three-dimensional information is calculated by, for example, calculating a top surface shape, a top surface height and a top surface inclination of the inspection object 102. The first three-dimensional information is calculated by, for example, using a computer.

For example, a top surface height of the connector 16 and a too surface inclination of the connector 16 are measured. The top surface height of the connector 16 and the top surface inclination of the connector 16 are based on a top surface height and a top surface inclination of the lead frame 10.

After the second image is obtained, the second three-dimensional information of the inspection object 102 is calculated based on the second image by using the optical cutting method. The second three-dimensional information is calculated by, for example, calculating the top surface shape, the top surface height and the top surface inclination of the inspection object 102. The second three-dimensional information is calculated by, for example, using the computer.

By, for example, using a calculation result of the first three-dimensional information and a calculation result of the second three-dimensional information, it is possible to more precisely calculate three-dimensional information.

A calculation target range of the first three-dimensional information or a calculation target range of the second three-dimensional information is, for example, an entire inspection light irradiation range (or irradiation area). In other words, an inspection range (or inspection area) of the inspection method according to the first embodiment is an entire inspection light irradiation range. The inspection range may be limited to a predetermined region. For example, the inspection range may be only the top surface of the connector 16.

Figure 6A:
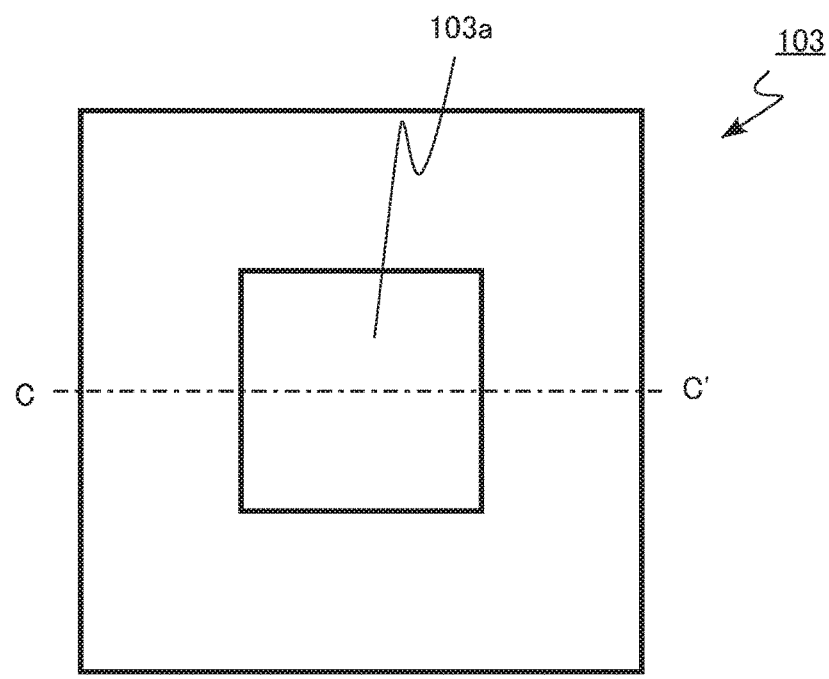
FIGS. 6A and 6B are explanatory views of the semiconductor device inspection method according to the first embodiment.
Figure 6B:
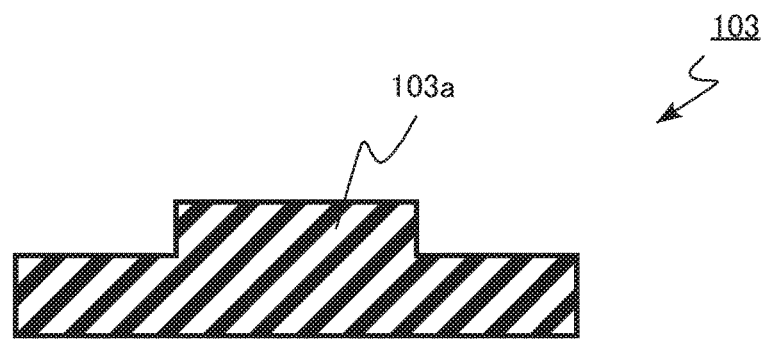

FIGS. 6A and 6B are explanatory views of the semiconductor device inspection method according to the first embodiment. FIGS. 6A and 61B are schematic views of an example of an inspection object. FIG. 6A is an upper view, and FIG. 6B is a CC' cross-sectional view of FIG. 6A. An inspection object 103 illustrated in FIGS. 6A and 6B includes a protrusion 103a.

Figure 7A:
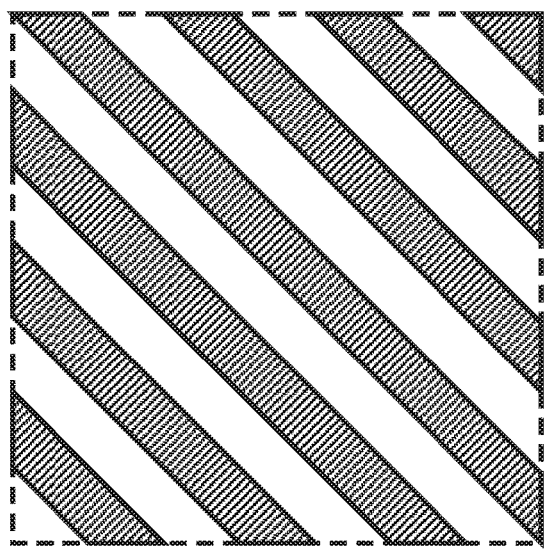
FIGS. 7A and 7B are explanatory views of the semiconductor device inspection method according to the first embodiment.
Figure 7A:
Figure 7B:
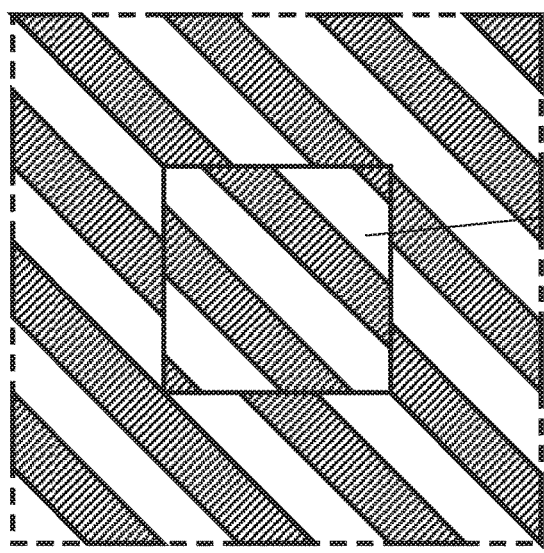
Figure 7B:

FIGS. 7A and 7B are explanatory views of the semiconductor device inspection method according to the first embodiment. FIGS. 7A and 7B are the explanatory views of the optical cutting method according to the first embodiment. FIG. 7A illustrates an inspection light irradiation pattern, and FIG. 7B illustrates a state where the inspection object 103 is irradiated with inspection light.

As illustrated in FIG. 7B, the protrusion 103a is higher than the surroundings, and therefore causes displacement of linear beams of the inspection light. By geometrically calculating this displacement as a numerical value, it is possible to calculate three-dimensional information of the inspection object 103 including the protrusion 103a.

More specifically, for example, a top surface height of the protrusion 103a can be calculated based on top surface heights of the surroundings of the protrusion 103a. Furthermore, it is possible to calculate, for example, a top surface inclination of the protrusion 103a based on the calculated height.

Next, a function and an effect of the inspection method according to the first embodiment will be described.

To realize high product yield, inspection of an external appearance of a semiconductor chip disposed on a lead frame, and inspection of an external appearance of a metal member such as a connector or a heat dissipation part disposed on a semiconductor chip are performed during a semiconductor manufacturing process. For example, to realize double-sided heat dissipation, there is provided a semiconductor package with a metal member such as a connector or a heat dissipation part exposed from a top surface of a sealing resin. According to such a semiconductor package, control of a top surface height and a top surface inclination of the metal member directly leads to a product yield. Furthermore, by increasing a throughput of the external appearance inspection, it is possible to reduce semiconductor package manufacturing cost. Therefore, it is demanded to three-dimensionally measure a top surface of an inspection object in a short time during the external appearance inspection.

Figure 8:
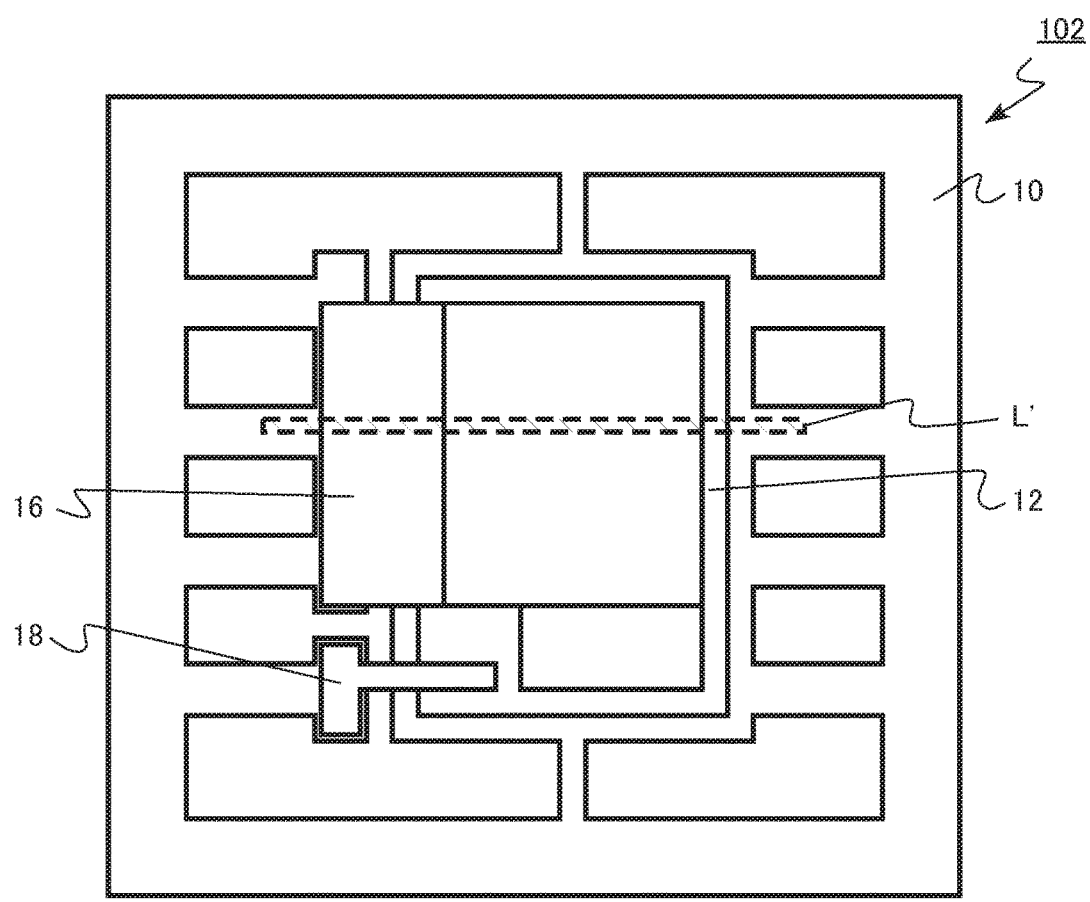
FIG. 8 is a view illustrating an irradiation range of inspection light of a semiconductor device inspection method according to a comparative example.

FIG. 8 is a view illustrating an irradiation range of inspection light of a semiconductor device inspection method according to a comparative example. A region L' in FIG. 8 is a region irradiated with inspection light.

The semiconductor device inspection method according to the comparative example radiates one linear inspection light beam, and measures the height of the one linear region by using a line sensor. The inspection light beam is, for example, a laser beam. The sensor is, for example, a laser sensor.

According to the semiconductor device inspection method of the comparative example, three-dimensional information that can be obtained at a time is only the height of the one linear region. Therefore, it is not possible to measure, for example, a top surface inclination of an inspection object. If obtaining information of a planar region is tried, it is necessary to scan the one linear inspection light beam and repeat measurement. In this case, external appearance inspection requires a long time.

The semiconductor device inspection method according to the first embodiment collectively irradiates an inspection object with a plurality of linear beams parallel to each other. Furthermore, for example, a CCD camera is used to obtain a two-dimensional image. It is possible to collectively obtain information of a wide region from the obtained two-dimensional image. Consequently, it is possible to measure, for example, a top surface inclination of an inspection object in a short time.

It is preferable to perform first three-dimensional measurement based on a first image obtained by radiation of the first inspection light, and, in addition, second three-dimensional measurement based on a second image obtained by radiation of second inspection light in a direction different from the first inspection light. By obtaining information of the top surface of the inspection object from a different irradiation pattern, inspection precision improves.

The LED projector preferably radiates the first inspection light. Consequently, it is easy to irradiate the inspection object with a pattern that planarly widens in a wide range.

As described above, the first embodiment can realize the semiconductor device inspection method that can three-dimensionally measure a top surface of an inspection object in a short time.

Second Embodiment

A semiconductor device inspection method according to a second embodiment differs from the first embodiment in including irradiating the semiconductor chip or the metal member with third inspection light having a plurality of linear beams parallel to each other after calculating the first three-dimensional information, the plurality of linear beams of the third inspection light having a shorter pitch than a pitch of the plurality of linear beams of the first inspection light; obtaining a third image of the semiconductor chip irradiated with the third inspection light or the metal member irradiated with the third inspection light; and calculating third three-dimensional information of the semiconductor chip or the metal member based on the third image by using the optical cutting method. Hereinafter, part of contents that overlaps contents of the first embodiment will not be described.

The semiconductor device inspection method according to the second embodiment inspects an external appearance of an inspection object by using an inspection system 50. A case where an inspection object is inspection object 102 illustrated in FIGS. 2A and 2B will be described below as an example.

The semiconductor device inspection method according to the second embodiment includes first three-dimensional measurement including radiation of first inspection light, obtaining a first image and calculation of first three-dimensional information, and third three-dimensional measurement including radiation of third inspection light, obtaining a third image and calculation of third three-dimensional information.

First, the inspection object 102 is disposed on a stage 54. Next, the inspection object 102 is irradiated with first inspection light having a plurality of linear beams parallel to each other from the first direction inclining with respect to the top surface of a lead frame 10. The first inspection light are radiated from a first LED projector 51.

Next, the first image of the inspection object 102 irradiated with the first inspection light is obtained. The first image is captured by a CCD camera 53.

Next, the first three-dimensional information of the inspection object 102 is calculated based on the first image by using the optical cutting method. The first three-dimensional information is calculated by, for example, measuring a top surface shape, a top surface height and a top surface inclination of the inspection object 102. The first three-dimensional information is calculated by, for example, using a computer.

Next, the inspection object 102 is irradiated with third inspection light having a plurality of linear beams parallel to each other from the first direction inclining with respect to the top surface of the lead frame 10. Pitches of the plurality of linear beams of the third inspection light are shorter than the pitches of the plurality of linear beams of the first inspection light. The third inspection light is radiated from the first LED projector 51, for example.

When, for example, an abnormality is detected as a result of the calculation of the first three-dimensional information, measurement precision for the abnormal portion is increased to perform inspection again. The third inspection light is used to perform the inspection again.

Next, the third image of the inspection object 102 irradiated with the third inspection light is obtained. The third image is captured by the CCD camera 53.

Figure 9A:
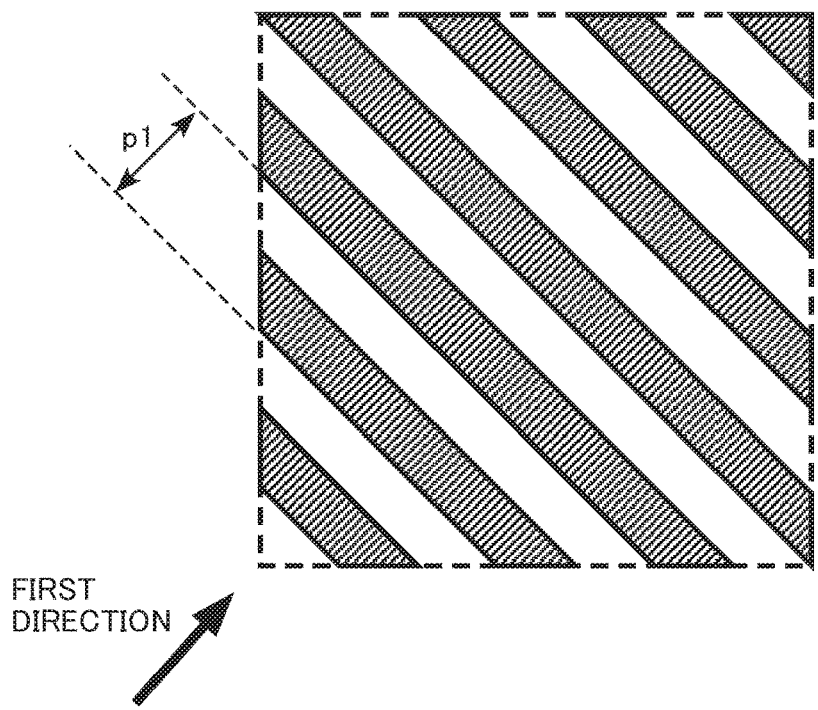
FIGS. 9A and 9B are views illustrating irradiation patterns of inspection light of a semiconductor device inspection method according to a second embodiment.
Figure 9B:
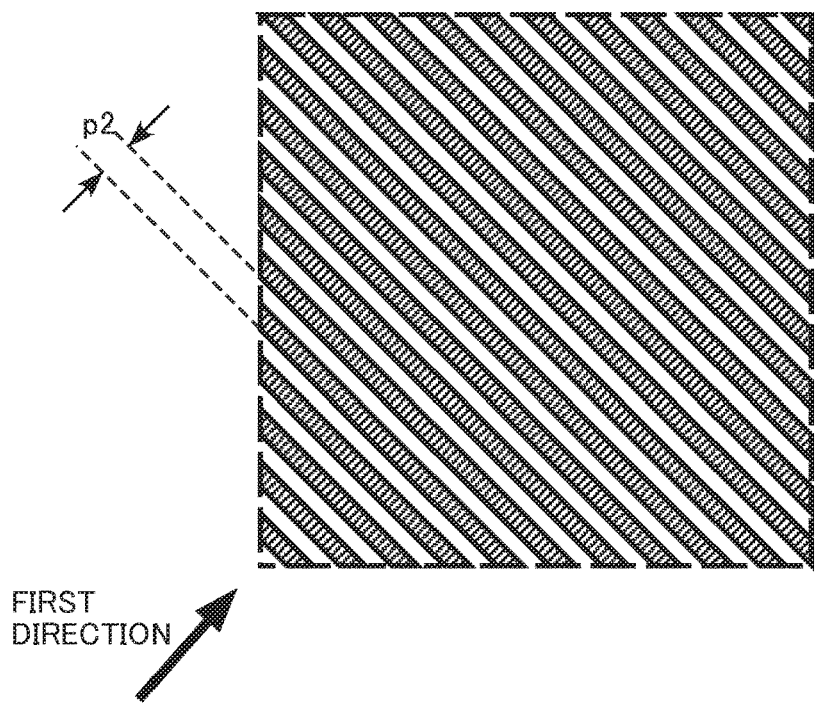

FIGS. 9A and 9B are views illustrating irradiation patterns of inspection light of the semiconductor device inspection method according to the second embodiment. FIG. 9A is the view illustrating an example of the irradiation pattern of the first inspection light. FIG. 9B is the view illustrating an example of the irradiation pattern of the third inspection light.

Hatched linear regions in FIGS. 9A and 9B are regions on which linear beams are shed. Inspection light has linear beams parallel to each other. The inspection light includes linear beams repeat at certain pitches.

The pitches (p2 in FIG. 9B) of the plurality of linear beams of the third inspection light are shorter than the pitches (p1 in FIG. 9A) of the plurality of linear beams of the first inspection light.

Figure 10:
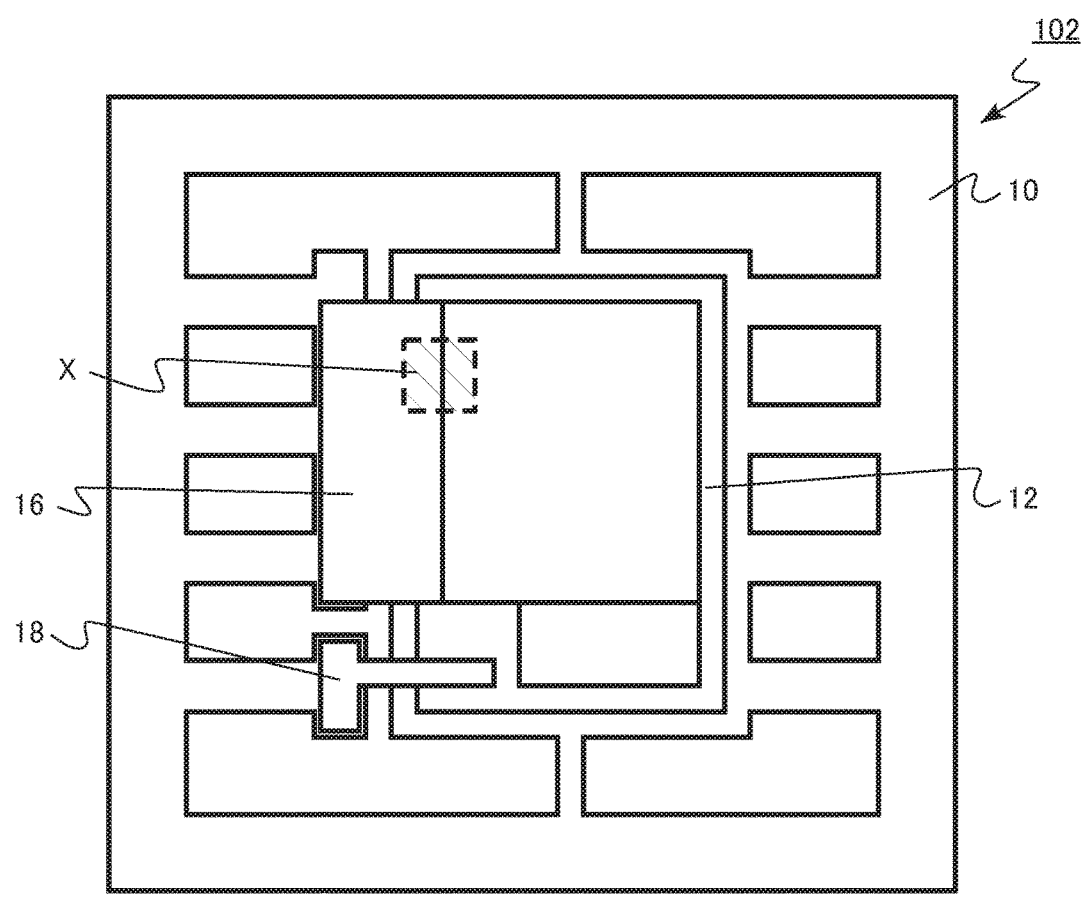
FIG. 10 is a view illustrating an inspection range of the semiconductor device inspection method according to the second embodiment.

FIG. 10 is a view illustrating an inspection range of the semiconductor device inspection method according to the second embodiment. A region X in FIG. 10 is an inspection range. The region X corresponds to part of a connector 16.

For example, the third three-dimensional information is calculated only for part of the connector 16 of the inspection object 102. For example, the part of the connector 16 is a region from which an abnormality has been detected by the calculation of the first three-dimensional information.

According to the semiconductor device inspection method of the second embodiment, it is possible to realize precise three-dimensional measurement by performing inspection again by using inspection light of short pitches.

It is preferable to narrow the inspection range of the third three-dimensional measurement compared to the inspection range of the first three-dimensional measurement from a viewpoint of reduction of an inspection time.

As described above, the second embodiment can realize the semiconductor device inspection method that can three-dimensionally measure a top surface of an inspection object in a short time. Furthermore, it is possible to realize the precise three-dimensional measurement.

Third Embodiment

A semiconductor device manufacturing method according to a third embodiment includes disposing a semiconductor chip on a lead frame; disposing a metal member on the semiconductor chip; irradiating the semiconductor chip or the metal member with first inspection light having a plurality of linear beams parallel to each other from a first direction inclining with respect to a top surface of the lead frame at least before disposing the metal member or after disposing the metal member, obtaining a first image of the semiconductor chip irradiated with the first inspection light or the metal member irradiated with the first inspection light, and calculating first three-dimensional information of the semiconductor chip or the metal member based on the first image by using an optical cutting method; and sealing the semiconductor chip and the metal member with a resin after the calculating the first three-dimensional information. When the semiconductor chip and the metal member are sealed with the resin, the top surface of the metal member is exposed from a top surface of the resin. The semiconductor device manufacturing method according to the third embodiment uses the semiconductor device inspection method according to the first embodiment or the second embodiment. Hereinafter, part of contents that overlaps contents of the first embodiment or the second embodiment will not be described.

The semiconductor device manufacturing method according to the third embodiment is a semiconductor device manufacturing method including a package with a metal member exposed from both surfaces of a sealing resin, i.e., a so-called double-sided heat dissipation package.

FIGS. 11A, 11B, 12A, 12B, 13A, 13B, 14A, 14B, 15A and 15B are schematic views illustrating the semiconductor device manufacturing method according to the third embodiment. FIGS. 11A, 12A, 13A, 14A and 15A are top views, and FIGS. 11B, 12B, 13B, 14B and 15B are cross-sectional views. FIGS. 11B, 12B, 13B, 14B and 15B are DID' cross-sectional views of FIGS. 11A, 12A, 13A, 14A and 15A.

Figure 11A:
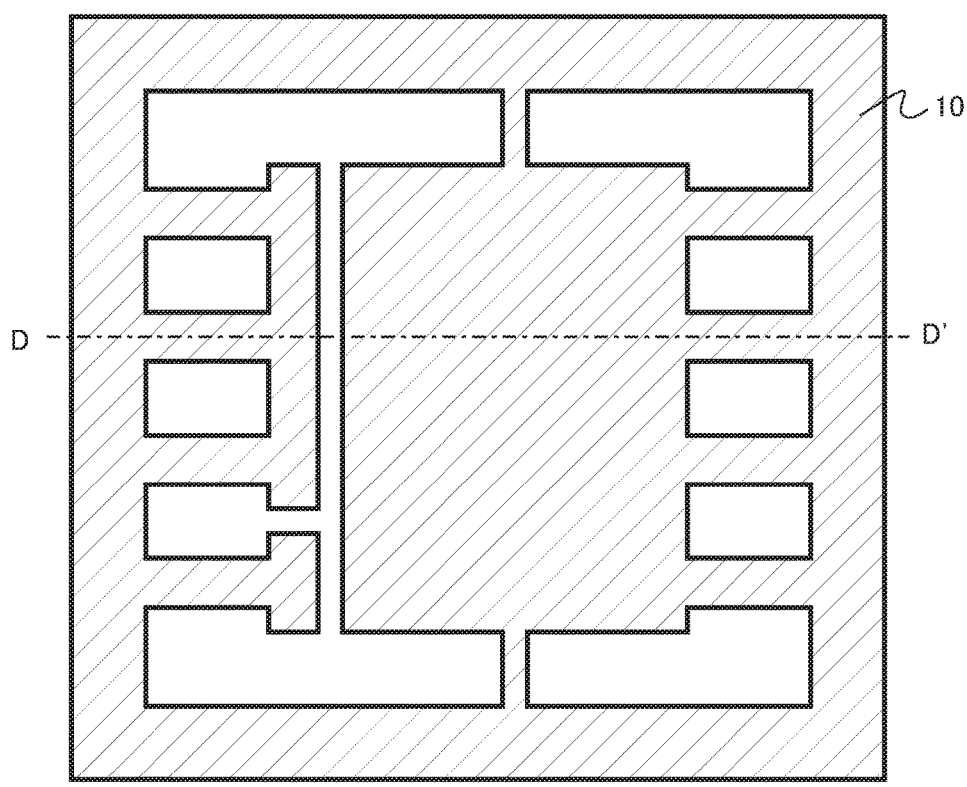
FIGS. 11A and 11B are schematic views illustrating a semiconductor device manufacturing method according to a third embodiment.
Figure 11B:

First, a lead frame 10 is prepared (FIGS. 11A and 11B).

Next, an adhesive 14 is applied onto the lead frame 10. The adhesive 14 is, for example, silver paste or solder.

Figure 12A:
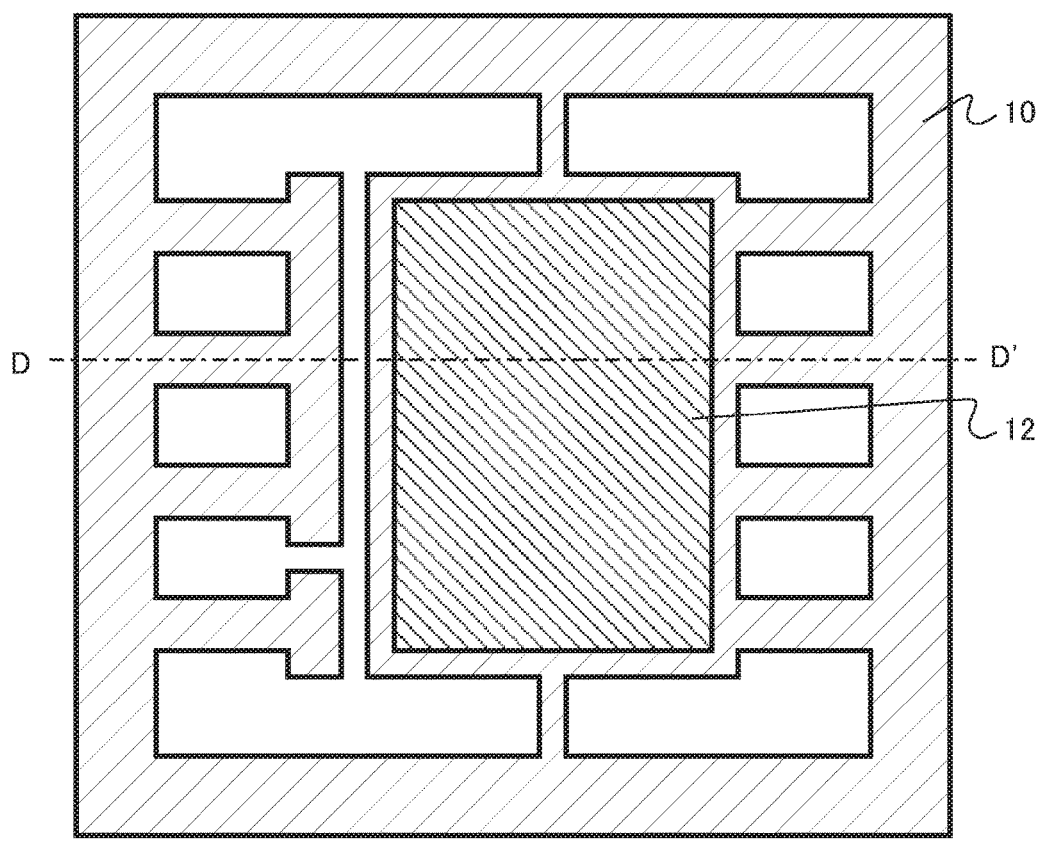
FIGS. 12A and 12B are schematic views illustrating the semiconductor device manufacturing method according to the third embodiment.
Figure 12B:
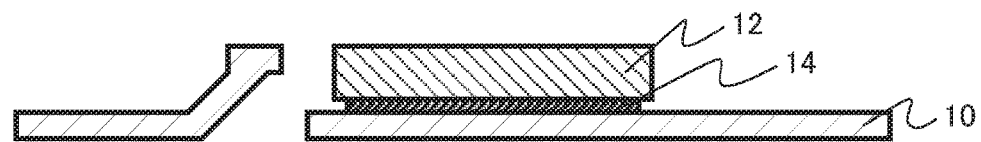

Next, a semiconductor chi 12 fixed onto the lead frame 10 by the adhesive 14 (FIGS. 12A and 12B). The semiconductor chip 12 is, for example, a MOSFET.

Next, first three-dimensional measurement is performed on a top surface of the semiconductor chip 12. First, the top surface of the semiconductor chip 12 is irradiated with first inspection light having a plurality of linear beams parallel to each other from the first direction inclining with respect to the top surface of the lead frame 10. Furthermore, a first image of the semiconductor chip 12 irradiated with the first inspection light is obtained. Furthermore, first three-dimensional information of the semiconductor chip 12 is calculated based on the first image by using the optical cutting method. For example, a top surface shape, a top surface height and a top surface inclination of the semiconductor chip 12 are calculated.

Figure 13A:
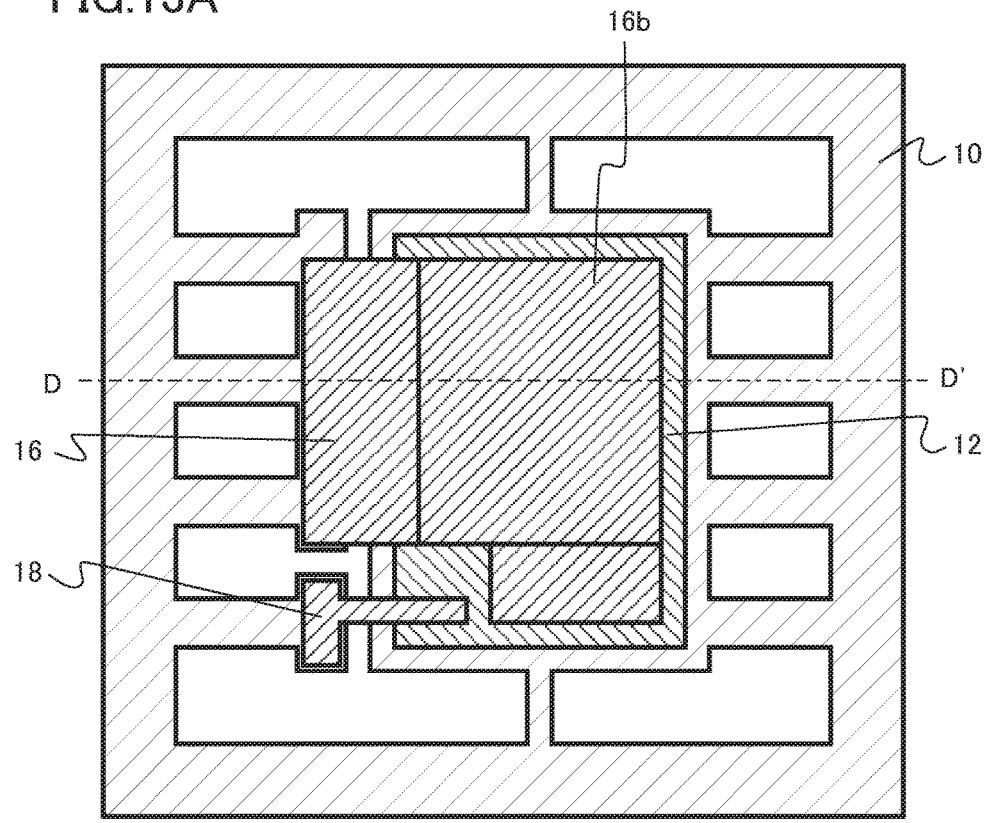
FIGS. 13A and 13B are schematic views illustrating the semiconductor device manufacturing method according to the third embodiment.
Figure 13B:
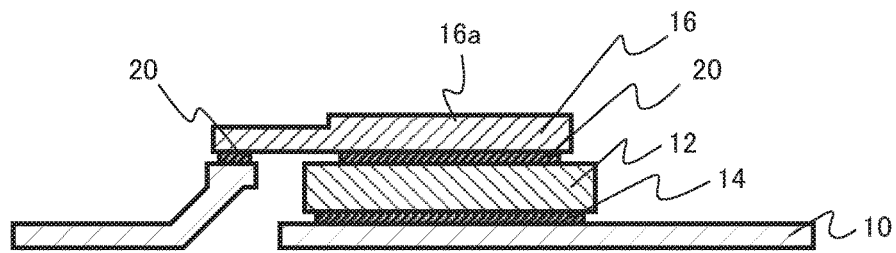

Next, an adhesive 20 is applied onto the semiconductor chip 12. The adhesive 20 is, for example, silver paste or solder. Next, a connector 16 and a connector 18 are fixed onto the semiconductor chip 12 (FIGS. 13A and 13B). The connector 16 is provided with a protrusion. 16a.

Next, second three-dimensional measurement is performed on a top surface of the connector 16. First, the top surface of the connector 16 is irradiated with first inspection light having a plurality of linear beams parallel to each other from the first direction inclining with respect to the top surface of the lead frame 10. Furthermore, a first image of the connector 16 irradiated with the first inspection lights is obtained. Furthermore, first three-dimensional information of the connector 16 is calculated based on the first image by using the optical cutting method. For example, a top surface shape, a top surface height and a top surface inclination of the connector 16 are calculated.

Figure 14A:
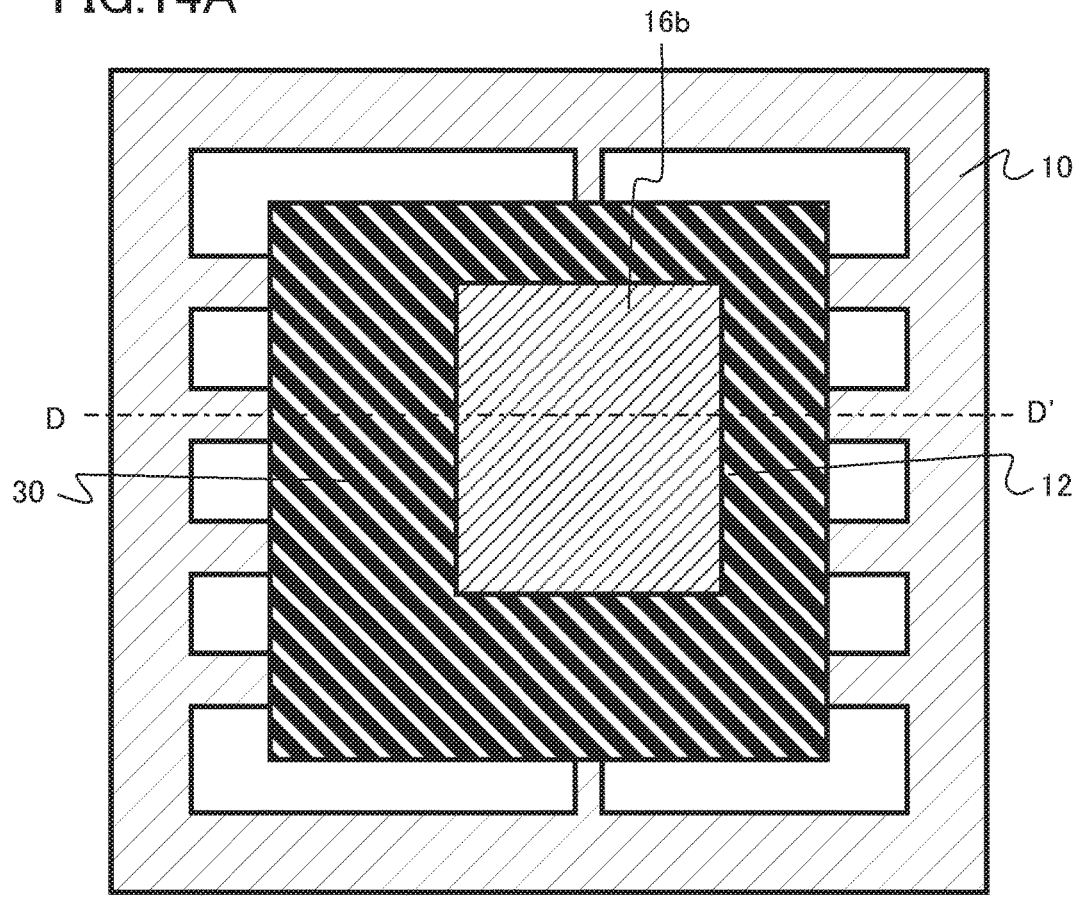
FIGS. 14A and 14B are schematic views illustrating the semiconductor device manufacturing method according to the third embodiment.
Figure 14B:
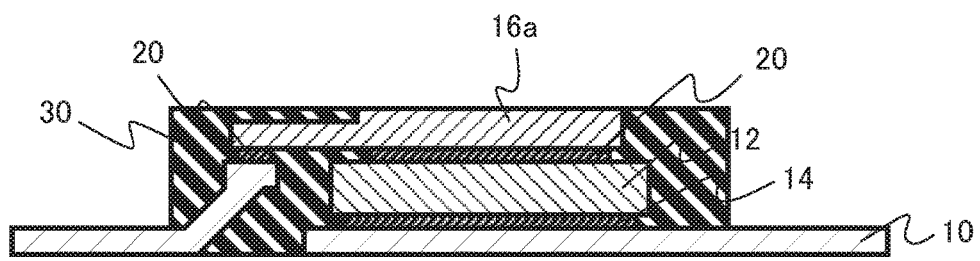

Next, the semiconductor chip 12, the connector 16 and the connector 18 are sealed with a molding resin 30 by using an unillustrated mold (FIGS. 14A and 14B). The molding resin 30 is, for example, an epoxy resin. The molding resin 30 is an example of a resin.

During the sealing with the molding resin 30, part of the connector 16 is exposed from a top surface of the molding resin 30 on a side opposite to the lead frame 10. During the sealing with the molding resin 30, the protrusion 16a of the connector 16 is exposed from the top surface of the molding resin 30. In addition, part of the lead frame 10 is exposed from a back surface of the molding resin 30. The metals having good heat dissipation are exposed from both of the top surface and the back surface of the molding resin 30.

Figure 15A:
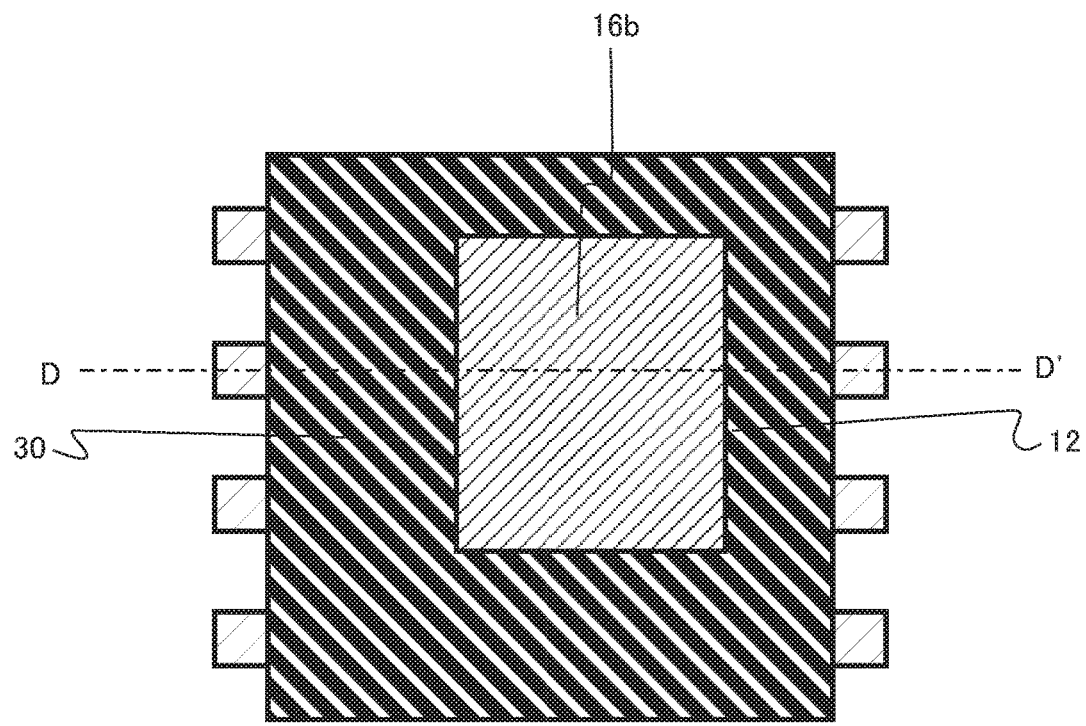
FIGS. 15A and 15B are schematic views illustrating the semiconductor device manufacturing method according to the third embodiment.
Figure 15B:
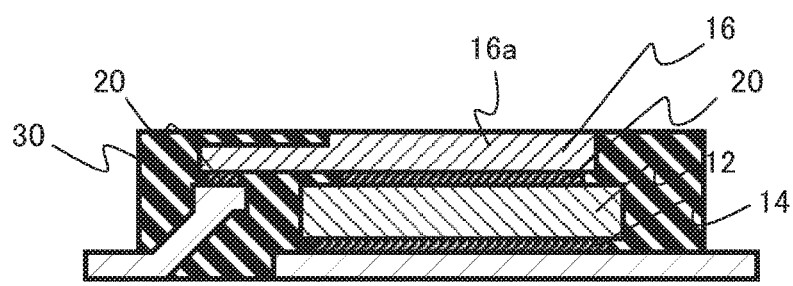

Next, the lead frame 10 is cut (FIGS. 15A and 15B).

According to the above manufacturing method, the MOSFET including the double-sided heat dissipation package is manufactured.

For example, there is a case where the top surface height and the top surface inclination of the connector 16 fixed onto the semiconductor chip 12 do not settle in a predetermined range. In this case, after the sealing with the molding resin 30, the protrusion 16a of the connector 16 is concerned to be buried in the molding resin 30. The MOSFET with the protrusion 16a of the connector 16 buried in the molding resin 30 is a defective product. Therefore, the top surface height and the top surface inclination of the connector 16 need to be precisely controlled.

The semiconductor device manufacturing method according to the third embodiment three-dimensionally measures the top surface of the semiconductor chip 12 and three-dimensionally measures the top surface of the connector 16 during manufacturing of MOSFETs. Consequently, it is possible to precisely control the top surface height and the top surface inclination of the connector 16. Three-dimensional measurement results are fed back under various process conditions, for example, and contribute to improvement of a MOSFET mounting yield.

As described above, the semiconductor device manufacturing method according to the third embodiment improves the MOSFET mounting yield.

The first and second embodiments have described the examples of the cases where a substrate on which the semiconductor chip 12 is disposed is the lead frame 10. However, the substrate may be other substrates such as a resin substrate, a ceramic substrate and a mounting tape as long as the semiconductor chip can be disposed on this substrate.

Furthermore, the third embodiment has described the example of the MOSFET having the double-sided heat dissipation package. However, the present disclosure is applicable to a process of mounting other semiconductor devices.

Furthermore, the third embodiment has described the example of the case where both of the first three-dimensional measurement and the second three-dimensional measurement are performed. However, one of the first three-dimensional measurement and the second three-dimensional measurement can be performed.

Furthermore, the third embodiment has described the example of the case where the metal member is the connector 16. However, the metal member exposed on the molding resin 30 may be, for example, a heat dissipation member adhered onto the connector 16.

Furthermore, the third embodiment has described the example of the case where both of the three-dimensional measurement of the semiconductor chip 12 and the three-dimensional measurement of the connector 16 are performed. However, one of the three-dimensional measurement of the semiconductor chip 12 and the three-dimensional measurement of the connector 16 can be performed.

Furthermore, according to the third embodiment, when the semiconductor chip 12 is three-dimensionally measured or the connector 16 is three-dimensionally measured, it is also possible to perform the second three-dimensional measurement using the second inspection light or third third-dimensional measurement using the third inspection light.

While certain embodiments have been described, these embodiments have been presented by way of example only, and are not intended to limit the scope of the inventions. Indeed, the semiconductor device inspection method and the semiconductor device manufacturing method described herein may be embodied in a variety of other forms; furthermore, various omissions, substitutions and changes is the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device inspection method comprising:
   irradiating a semiconductor chip or a metal member with first inspection light having a plurality of linear beams parallel to each other from a first direction inclining with respect to a top surface of a substrate, the semiconductor chip being disposed on the substrate, and the metal member being disposed on the semiconductor chip;
   obtaining a first image of the semiconductor chip irradiated with the first inspection light or the metal member irradiated with the first inspection light; and
   calculating first three-dimensional information of the semiconductor chip or the metal member based on the first image by using an optical cutting method.

2. The semiconductor device inspection method according to claim 1, wherein the calculating first three-dimensional information includes calculating a height based on the top surface of the substrate and calculating an inclination based on the top surface of the substrate.

3. The semiconductor device inspection method according to claim 1, further comprising:
   irradiating the semiconductor chip or the metal member with second inspection light having a plurality of linear beams parallel to each other from a second direction inclining with respect to the top surface of the substrate, and the second direction being different from the first direction;
   obtaining a second image of the semiconductor chip irradiated with the second inspection light or the metal member irradiated with the second inspection light; and
   calculating second three-dimensional information of the semiconductor chip or the metal member based on the second image by using the optical cutting method.

4. The semiconductor device inspection method according to claim 1, further comprising:
   irradiating the semiconductor chip or the metal member with third inspection light having a plurality of linear beams parallel to each other after calculating the first three-dimensional information, the plurality of linear beams of the third inspection light having a shorter pitch than a pitch of the plurality of linear beams of the first inspection light;
   obtaining a third image of the semiconductor chip irradiated with the third inspection light or the metal member irradiated with the third inspection light; and
   calculating third three-dimensional information of the semiconductor chip or the metal member based on the third image by using the optical cutting method.

5. The semiconductor device inspection method according to claim 1, wherein the first image is obtained by a charge coupled device (CCD) camera.

6. The semiconductor device inspection method according to claim 5, wherein the first image is obtained by the CCD camera provided in a normal direction of the substrate.

7. The semiconductor device inspection method according to claim 1, wherein the first inspection light are radiated by a light emitting diode (LED) projector.

8. A semiconductor device manufacturing method comprising:
   disposing a semiconductor chip on a lead frame;
   disposing a metal member on the semiconductor chip;
   irradiating the semiconductor chip or the metal member with first inspection light having a plurality of linear beams parallel to each other from a first direction inclining with respect to a top surface of the lead frame at least before disposing the metal member or after disposing the metal member, obtaining a first image of the semiconductor chip irradiated with the first inspection light or the metal member irradiated with the first inspection light, and calculating first three-dimensional information of the semiconductor chip or the metal member based on the first image by using an optical cutting method; and
   sealing the semiconductor chip and the metal member with a resin after calculating the first three-dimensional information.

9. The semiconductor device manufacturing method according to claim 8, wherein, when the semiconductor chip and the metal member are sealed with the resin, a top surface of the metal member is exposed from a top surface of the resin.

10. The semiconductor device manufacturing method according to claim 8, wherein the calculation of the first three-dimensional information includes calculating a height based on the top surface of the lead frame and calculating an inclination based on the top surface of the lead frame.

* * * * *